United States Patent
Zhou et al.

(10) Patent No.: US 9,017,920 B2
(45) Date of Patent: Apr. 28, 2015

(54) FILM, METHOD FOR MANUFACTURING THE FILM AND MASKING METHOD USING THE FILM

(75) Inventors: Quan Zhou, Shenzhen (CN); Chao-Sheng Huang, Shenzhen (CN); Xin-Wu Guan, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 181 days.

(21) Appl. No.: 13/539,617

(22) Filed: Jul. 2, 2012

(65) Prior Publication Data
US 2013/0160939 A1    Jun. 27, 2013

(30) Foreign Application Priority Data
Dec. 22, 2011   (CN) .......................... 2011 1 0434868

(51) Int. Cl.
  *G03F 7/027*   (2006.01)
  *G03F 7/004*   (2006.01)
  *G03F 7/038*   (2006.01)

(52) U.S. Cl.
  CPC .............. *G03F 7/0045* (2013.01); *G03F 7/038* (2013.01); *Y10S 430/114* (2013.01); *Y10S 430/106* (2013.01); *Y10S 430/128* (2013.01)

(58) Field of Classification Search
  USPC ............. 430/270.1, 927, 281.1, 284.1, 285.1, 430/905, 906, 908, 926, 913
  See application file for complete search history.

(56) References Cited

U.S. PATENT DOCUMENTS

| | | | | |
|---|---|---|---|---|
| 3,053,785 A | * | 9/1962 | Rosenbloom | 524/96 |
| 3,677,178 A | * | 7/1972 | Gipe | 101/450.1 |
| 3,779,758 A | * | 12/1973 | Polichette | 430/315 |
| 3,877,948 A | * | 4/1975 | Yonezawa et al. | 430/270.1 |
| 3,930,963 A | * | 1/1976 | Polichette et al. | 205/126 |
| 3,977,009 A | * | 8/1976 | Ohtsuka et al. | 346/74.2 |
| 4,210,711 A | * | 7/1980 | Kitajima et al. | 430/253 |
| 4,273,833 A | * | 6/1981 | De Long | 114/361 |
| 4,564,580 A | * | 1/1986 | Ichimura et al. | 430/281.1 |
| 4,587,201 A | * | 5/1986 | Morikawa et al. | 430/284.1 |
| 4,943,512 A | * | 7/1990 | Kawabata et al. | 430/197 |
| 5,013,629 A | * | 5/1991 | Sekine et al. | 430/138 |
| 5,270,420 A | * | 12/1993 | Tanaka et al. | 526/329 |
| 5,710,234 A | * | 1/1998 | Fujishiro et al. | 528/106 |
| 5,792,589 A | * | 8/1998 | Udagawa et al. | 430/270.1 |
| 5,948,592 A | * | 9/1999 | Umehara et al. | 430/270.1 |
| 6,060,210 A | * | 5/2000 | Eda et al. | 430/257 |
| 6,784,275 B2 | * | 8/2004 | Ichinose et al. | 528/170 |
| 6,875,479 B2 | * | 4/2005 | Jung et al. | 427/493 |
| 7,994,071 B2 | * | 8/2011 | Koo et al. | 438/780 |
| 8,445,177 B2 | * | 5/2013 | Kawamori et al. | 430/281.1 |
| 2009/0197090 A1 | * | 8/2009 | Hahn et al. | 428/418 |
| 2011/0223397 A1 | * | 9/2011 | Kawamori et al. | 428/195.1 |
| 2012/0028418 A1 | * | 2/2012 | Asai et al. | 438/114 |
| 2012/0089180 A1 | * | 4/2012 | Fathi et al. | 606/214 |
| 2013/0126838 A1 | * | 5/2013 | Jeong et al. | 257/40 |
| 2013/0251985 A1 | * | 9/2013 | Nakanishi et al. | 428/339 |

FOREIGN PATENT DOCUMENTS

JP        05210008 A  *  8/1993

* cited by examiner

*Primary Examiner* — Amanda C. Walke
(74) *Attorney, Agent, or Firm* — Novak Druce Connolly Bove + Quigg LLP

(57) ABSTRACT

A film includes base and a photosensitive layer formed on the base. The photosensitive layer substantially includes a first photosensitive agent, a second photosensitive agent, and a thermosol. The first photosensitive agent is water-soluble. The second photosensitive agent is an aromatic ketone compound or a benzoin ether compound. The method for manufacturing the film and the masking method using the film is also provided.

13 Claims, 4 Drawing Sheets

FILM, METHOD FOR MANUFACTURING THE FILM AND MASKING METHOD USING THE FILM

BACKGROUND

1. Technical Field

The exemplary disclosure generally relates to a film, a method for manufacturing the film, and a masking method using the film.

2. Description of Related Art

Metal substrates are usually decorated by having a portion of the surface of the substrate subjected to a sandblasted or a polished process. During the sandblasted or polished process, the other portions of the surface may be masked by an ink or plastic film. However, the masking process is complicated. Furthermore, after being decorated, the ink film is necessary to be removed using special chemicals. The removing process is not environmental friendly. Masking using the plastic film commonly requires an extra adhesive layer formed between the substrate and the plastic film to enhance the security of the mask. However, it is difficult to evenly distribute the adhesive layer between the substrate and the plastic film, thus the plastic film cannot precisely mask the desired regions of the substrate.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary disclosure. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
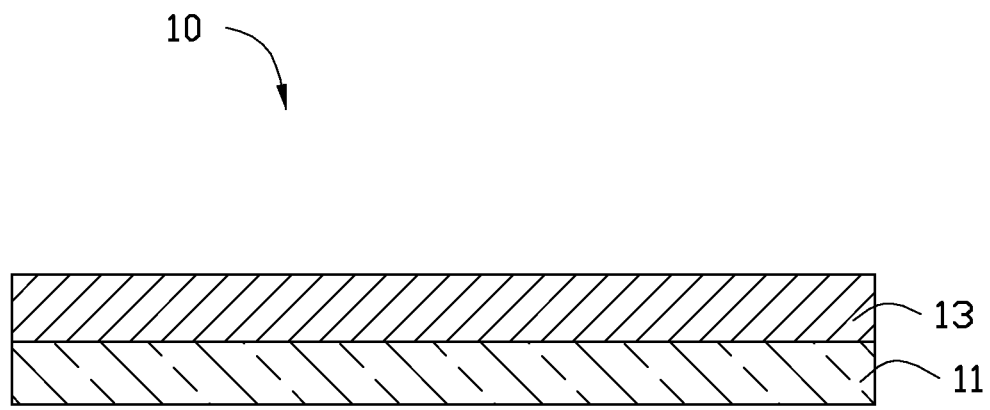
FIG. 1 is a cross-sectional view of an exemplary embodiment of a film.

FIG. 1 shows an exemplary embodiment of a film 10. The film 10 includes a base 11 and a photosensitive layer 13 formed on the base 11.

The base 11 is made of polyester having a high-temperature resistance. The polyester may be polyethylene terephthalate (PET).

The photosensitive layer 13 is water-soluble. The photosensitive layer 13 substantially includes a first photosensitive agent, a second photosensitive agent, and a thermosol, wherein the mass percentage of the first photosensitive agent is about 80% to about 90%, the mass percentage of the second photosensitive agent is about 5% to about 10%, the mass percentage of the thermosol is about 5% to about 10%. The thickness of the photosensitive layer 13 is about 30 μm to about 50 μm.

The first photosensitive agent is water-soluble. In the embodiment, the first photosensitive agent is ammonium bichromate.

The second photosensitive agent is substantially aromatic ketone compound(s) or benzoin ether compound(s). The aromatic ketone compound(s) can be benzophenone, halogenobenzophenone or 4-vinyl lenzyl-4'-methoxybenzophenone. The benzoin ether compound(s) can be 2,2-dimethoxy-2-phenylacetophenone, benzoin butyl ether, or benzoin ethyl ether.

The thermosol is water-soluble. The thermosol may be made of ethylene-vinyl acetate copolymer (EVA), polyethylene (PE), polyamide (PA), polyurethane (PU), or thermoplastic polyurethane elastomer (TPU).

A method for manufacturing the film 10 includes the following steps:

The base 11 is provided. The base 11 is made of polyester having a high-temperature resistance.

A photosensitive adhesive is made by the following steps: First, the second photosensitive agent is dissolved in about 80 ml to about 120 ml of deionized water. Second, the first photosensitive agent and the thermosol are added to the deionized water to create a colloid. Then, the colloid is heated in a dark room while being stirred to dissolve the colloid. After heating, the dissolved colloid is continuously stirred at an ambient temperature of about 5° C. to about 25° C. for about 30 minutes (min) to about 60 min to eliminate any foam that may have formed in the dissolved colloid. The stirring speed of the dissolved colloid is about 40 revolutions per minute (rpm) to about 60 rpm.

The photosensitive layer 13 is formed on the base 11. The photosensitive adhesive is coated on the base 11 and is baked at an internal oven temperature of about 40° C. to about 50° C. for about 3 hours (h) to about 5 h to form the film 10.

Figure 4:
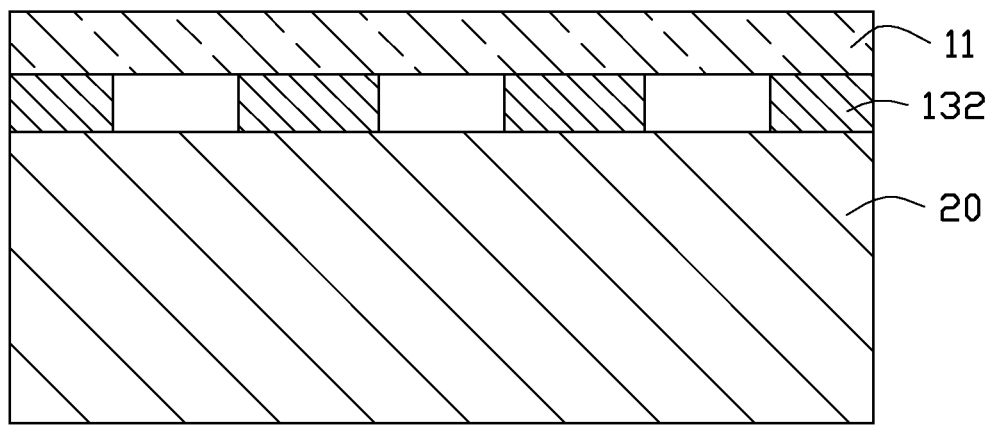
FIG. 4 is a cross-sectional view of a substrate coated with the film of FIG. 3.

Referring to FIG. 4, a masking method using the film 10 may include the following steps:

A substrate 20 is provided. The substrate 20 may be made of metal or non-metal. In the embodiment, the substrate 20 is made of stainless steel.

Figure 2:
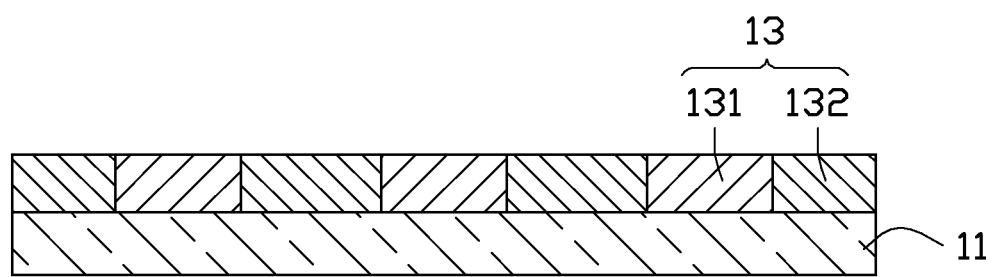
FIG. 2 is a cross-sectional view of the film shown in FIG. 1 after being exposed.
Figure 3:
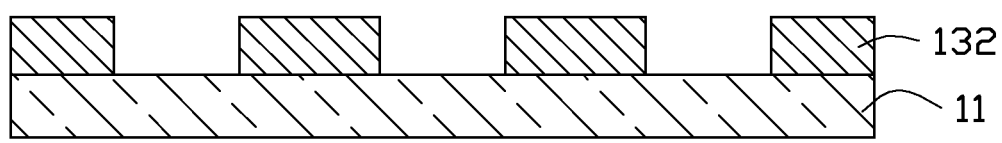
FIG. 3 is a cross-sectional view of the film shown in FIG. 2 after being developed.

FIGS. 2 and 3, illustrate a hard layer 132 is formed on the base 11 by exposing and developing the film 10. In the exemplary embodiment, the film 10 is partially exposed to ultraviolet light to allow the photosensitive layer 13 to form a water soluble layer 131 and a hard layer 132. The film 10 is then washed by high pressure water to remove the water soluble layer 131.

The film 10 is pasted on the substrate 20. In the embodiment, the film 10 is baked at an internal oven temperature of about 30° C. to about 50° C. for about 10 min to about 20 min to soften the thermosol of the hard layer 132. Then, the film 10 is pasted to the substrate 20 with the softened hard layer 132 directly contacting the surface of the substrate 20. The film 10 may be scraped using a brush or a sheet to exclude the atmosphere that may have enclosed between the hard layer 132 and the substrate 20. When the hard layer 132 is securely bonded to the substrate 20, the base 11 is split from the hard layer 132. Before the film 10 is scraped, the film 10 can be further heated at an internal oven temperature of about 80° C. to about 100° C. to further enhance the bond between the hard layer 132 and the substrate 20.

The substrate 20 is sandblasted, polished or wire drawn treated to decorate the regions of the substrate 20 not covered with the hard layer 132.

The hard layer 132 is removed from the substrate 20 by immersing the substrate 20 in water for about 3 min to about 5 min.

The softened thermosol of the hard layer 132 of the exemplary embodiment acts as a bond which securely bonds the film 10 to the substrate 20. Compared to the traditional ink film or plastic film, using the film 10 to mask the substrate 20 is very simple. Furthermore, the film 10 can precisely mask the substrate 20. Additionally, the water soluble layer 131 and the hard layer 132 both can be removed by water rather than chemicals. Thus, the use of the film 10 is environmentally friendly.

EXAMPLE 1

Making the photosensitive adhesive: 1 kg ammonium bichromate was dissolved in about 80 ml deionized water. 38 ml benzophenone and 60 g TPU thermosol were added to the deionized water to create a colloid. The colloid was stirred and was heated in a dark room to dissolve the colloid. The colloid was continuously stirred at an ambient temperature of about 20° C. to eliminate any foam that may have formed in the dissolved colloid. The stirring speed of the dissolved colloid was about 45 rpm for about 20 min.

Forming the photosensitive layer 13: the photosensitive adhesive was coated on the base 11 and baked at an internal oven temperature of about 40° C. for about 5 h. The photosensitive layer 13 had a thickness of about 40 µm.

Forming the hard layer 132: the film 10 was partially exposed to ultraviolet light to allow the photosensitive layer 13 to form a water soluble layer 131 and a hard layer 132. The film 10 was then washed using high pressure water to remove the water soluble layer 131.

Pasting the film 10 on the substrate 20: the film 10 was heated at an internal oven temperature of about 40° C. for about 15 min. The film 10 was pasted to the substrate 20 with the hard layer 132 directly contacting the surface of the substrate 20. The film 10 may be scraped using a brush or a sheet to exclude the atmosphere that may have enclosed between the hard layer 132 and the substrate 20. When the hard layer 132 was securely bonded to the substrate 20, the base 11 was split from the hard layer 132. The substrate 20 was made of stainless steel.

The substrate 20 was sandblasted to form a sandblasted pattern in the surface of the substrate 20, which was not covered with the hard layer 132.

The hard layer 132 was removed by immersing the substrate 20 in water for about 3 min.

EXAMPLE 2

Making the photosensitive adhesive: 1 kg ammonium bichromate was dissolved in about 80 ml deionized water. 69 ml benzoin ethyl ether and 70 g TPU thermosol were added to the deionized water to create a colloid. The colloid was stirred and was heated in a dark room to dissolve the colloid. The colloid was continuously stirred at an ambient temperature of about 20° C. to eliminate any foam that may have formed in the dissolved colloid. The stirring speed of the dissolved colloid was about 50 rpm for about 20 min.

Forming the photosensitive layer 13: the photosensitive adhesive was coated on the base 11 and baked at an internal oven temperature of about 45° C. for about 3 h. The photosensitive layer 13 had a thickness of about 45 µm.

Forming the hard layer 132: the film 10 was partially exposed to ultraviolet light to allow the photosensitive layer 13 to form a water soluble layer 131 and a hard layer 132. The film 10 was then washed using high pressure water to remove the water soluble layer 131.

Pasting the film 10 on the substrate 20: the film 10 was heated at an internal oven temperature of about 40° C. for about 10 min. The film 10 was pasted to the substrate 20 with the hard layer 132 directly contacting the surface of the substrate 20. The film 10 may be scraped using a brush or a sheet to exclude the atmosphere that may have enclosed between the hard layer 132 and the substrate 20. When the hard layer 132 was securely bonded to the substrate 20, the base 11 was split from the hard layer 132. The substrate 20 was made of stainless steel.

The substrate 20 was wire drawn treated to form a wire drawn pattern in the surface of the substrate 20, which was not covered with the hard layer 132.

The hard layer 132 was removed by immersing the substrate 20 in water for about 3 min.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. A film, comprising:
a base; and
a photosensitive layer formed on the base, the photosensitive layer substantially comprising a first photosensitive agent, a second photosensitive agent, and a thermosol, the first photosensitive agent being water-soluble, the second photosensitive agent being an aromatic ketone compound or benzoin ether compound, the mass percentage of the first photosensitive agent in the photosensitive layer being about 80% to about 90%.

2. The film as claimed in claim 1, wherein the mass percentage of the second photosensitive agent in the photosensitive layer is about 5% to about 10%.

3. The film as claimed in claim 1, wherein the mass percentage of the thermosol in the photosensitive layer is about 5% to about 10%.

4. The film as claimed in claim 1, wherein the first photosensitive agent is ammonium bichromate.

5. The film as claimed in claim 1, wherein the thickness of the photosensitive layer is about 30 µm to about 50 µm.

6. The film as claimed in claim 1, wherein the aromatic ketone compound is benzophenone, or halogenobenzophenone.

7. The film as claimed in claim 1, wherein the benzoin ether compound is 2,2-dimethoxy-2-phenylacetophenone, benzoin butyl ether, or benzoin ethyl ether.

8. The film as claimed in claim 1, wherein the thermosol is water-soluble.

9. A method for manufacturing a film, comprising:
providing a base;
providing a first photosensitive agent, a second photosensitive agent, and a thermosol, the first photosensitive agent being water-soluble, the second photosensitive agent being aromatic ketone compound or benzoin ether compound, the mass percentage of the first photosensitive agent in the photosensitive layer being about 80% to about 90%;
dissolving the second photosensitive agent in deionized water, the first photosensitive agent and the thermosol being added to the deionized water to create a colloid, the colloid being stirred and heated to dissolve the colloid to form a photosensitive adhesive;
forming a photosensitive layer on the base by coating the photosensitive adhesive to the base.

10. The method for manufacturing a film as claimed in claim 9, wherein in the photosensitive adhesive, the mass percentage of the second photosensitive agent is about 5% to about 10%, the mass percentage of the thermosol is about 5% to about 10%.

11. The method for manufacturing a film as claimed in claim 9, wherein the colloid is heated in a dark room while being stirred to dissolve the colloid, and the dissolved colloid is further continuous stirred at an ambient temperature of about 5 ° C. to about 25 ° C. for about 30min to about 60 min to eliminate any foam that may have formed in the dissolved colloid, the stirring speed of the dissolved colloid is about 40 rpm to about 60 rpm.

12. A masking method using a film, comprising:
providing a substrate;
providing a film, the film comprising a base and a photosensitive layer formed on the base, the photosensitive layer substantially comprising a first photosensitive agent, a second photosensitive agent, and a thermosol, the first photosensitive agent being water-soluble, the second photosensitive agent being an aromatic ketone compound or a benzoin ether compound, the mass percentage of the first photosensitive agent in the photosensitive layer being about 80% to about 90%;
a hard layer and a soluble layer being formed on the base by exposing and developing the film, the soluble layer being removed form the base;
softening the thermosol of the hard layer and pasting the film to the substrate, the hard layer being bonded to the substrate, and then the base being split to form the hard layer.

13. The masking method using a film as claimed in claim 12, wherein the thermosol of the hard layer is softened by baking the film at an internal oven temperature of about 30 ° C. to about 50 ° C. for about 10 min to about 20 min.

\* \* \* \* \*